United States Patent
Shin et al.

(10) Patent No.: US 9,702,058 B2
(45) Date of Patent: Jul. 11, 2017

(54) APPARATUS FOR FABRICATING INGOT

(75) Inventors: Dong Geun Shin, Seoul (KR); Chang Hyun Son, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 776 days.

(21) Appl. No.: 14/129,193

(22) PCT Filed: Jun. 13, 2012

(86) PCT No.: PCT/KR2012/004663
§ 371 (c)(1),
(2), (4) Date: Mar. 24, 2014

(87) PCT Pub. No.: WO2012/177012
PCT Pub. Date: Dec. 27, 2012

(65) Prior Publication Data
US 2014/0290580 A1    Oct. 2, 2014

(30) Foreign Application Priority Data

Jun. 24, 2011    (KR) .................. 10-2011-0061632

(51) Int. Cl.
C30B 23/06     (2006.01)
C30B 23/00     (2006.01)
C30B 29/36     (2006.01)

(52) U.S. Cl.
CPC ............ *C30B 23/005* (2013.01); *C30B 23/00* (2013.01); *C30B 29/36* (2013.01)

(58) Field of Classification Search
CPC ..................................................... C30B 23/06
See application file for complete search history.

(56) References Cited

U.S. PATENT DOCUMENTS

| | | | | |
|---|---|---|---|---|
| 6,336,971 B1 * | 1/2002 | Nagato | ................... | C30B 23/00 117/104 |
| 6,406,539 B1 * | 6/2002 | Shigeto | ................... | C30B 23/00 117/108 |
| 7,323,052 B2 * | 1/2008 | Tsvetkov | ............... | C30B 23/00 117/200 |
| 2006/0254505 A1 | 11/2006 | Tsvetkov et al. | | |
| 2007/0240630 A1 | 10/2007 | Leonard et al. | | |
| 2008/0072817 A1 | 3/2008 | Zwieback et al. | | |

OTHER PUBLICATIONS

International Search Report in International Application No. PCT/KR2012/004663, filed Jun. 13, 2012.

* cited by examiner

*Primary Examiner* — Robert M Kunemund
(74) *Attorney, Agent, or Firm* — Saliwanchik, Lloyd & Eisenschenk

(57) ABSTRACT

Disclosed is an apparatus for fabricating an ingot. The apparatus includes a crucible to receive a raw material, a holder disposed at an upper portion of the crucible to fix a seed, and a filter part in the crucible. The filter part is spaced apart from a surface of the raw material.

19 Claims, 1 Drawing Sheet

APPARATUS FOR FABRICATING INGOT

CROSS-REFERENCE TO RELATED APPLICATIONS

This application is the U.S. national stage application of International Patent Application No. PCT/KR2012/004663, filed Jun. 13, 2012, which claims priority to Korean Application No. 10-2011-0061632, filed Jun. 24, 2011, the disclosures of each of which are incorporated herein by reference in their entirety.

TECHNICAL FIELD

The disclosure relates to an apparatus for fabricating an ingot.

BACKGROUND ART

In general, materials are very important factors to determine the property and the performance of final products in the electric, electronic and mechanical industrial fields.

SiC represents the superior thermal stability and superior oxidation-resistance property. In addition, the SiC has the superior thermal conductivity of about 4.6 W/Cm?, so the SiC can be used for fabricating a large-size substrate having a diameter of about 2 inches or above. In particular, the single crystal growth technology for the SiC is very stable actually, so the SiC has been extensively used in the industrial field as a material for a substrate.

In the case of SiC, a scheme of growing the single crystal for SiC has been suggested through a seeded growth sublimation scheme. In this case, after putting SiC powders serving as a raw material in a crucible, a SiC single crystal serving as a seed is provided on the raw material. Temperature gradient is formed between the raw material and the seed, so that the raw material in the crucible is dispersed to the seed, and re-crystallized to grow a single crystal.

When a single SiC crystal is grown, carbon impurities and contaminants come from a raw material used to grow an SiC single crystal are introduced into the single SiC crystal, so that the single SiC crystal may be defective.

DISCLOSURE OF INVENTION

Technical Problem

The embodiment can grow a high-quality single crystal.

Solution to Problem

According to the embodiment, there is provided an apparatus for fabricating an ingot. The apparatus includes a crucible to receive a raw material, a holder positioned on the crucible and fixing a seed, and a filter part in the crucible. The filter part is spaced apart from the surface of the raw material.

Advantageous Effects of Invention

As described above, according to the apparatus for fabricating the ingot, the filter part can be spaced apart from the surface of the raw material. A first gas room can be positioned between the filter part and the seed holder, and a second gas room can be positioned between the filter part and the surface of the raw material. In the second gas room, the gas sublimated from the surface of the raw material can be homogenously and widely condensed on a lower end of the filter. The first gas room allows gas passing through the filter part to fully and uniformly move to the seed. Therefore, a single crystal, which is homogeneous and less defective, can be grown from the seed. In addition, the single crystal grown from the seed can be prevented from being formed in a convex shape at the central portion thereof. Therefore, the single crystal can be more effectively used. In other words, the product yield of the wafer obtained from the single crystal can be increased.

The filter part can adsorb the carbon impurities or trap the carbon impurities. The pores of the filter part can adsorb micro-impurities, and can block large-size impurities between the pores, so that the large-size impurities may be trapped. Therefore, the carbon impurities come from the raw material can be prevented from participating in the process of growing the single crystal. If the carbon impurities are moved to the single crystal, the single crystal may be defective. However, the filter part can prevent the single crystal from being defective.

An apparatus for fabricating an ingot according to another embodiment further includes an auxiliary filter part. The auxiliary filter part is positioned on the raw material, so that the raw material can be maintained in the flat state, and the impurities, which may be introduced into the raw material, can be blocked. In addition, the auxiliary filter part can control the sublimation speed of the raw materials in the initial growth stage, so that the high-quality single crystal can be grown.

MODE FOR THE INVENTION

Figure 1:
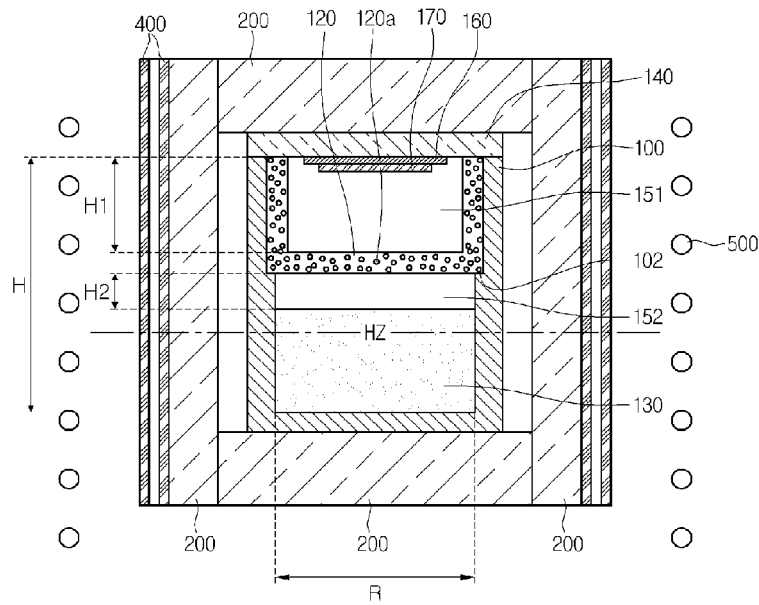
FIG. 1 is a sectional view showing an apparatus for fabricating an ingot according to the embodiment.

In the description of the embodiments, it will be understood that, when a layer (or film), a region, a pattern, or a structure is referred to as being "on" or "under" another layer (or film), another region, another pad, or another pattern, it can be "directly" or "indirectly" on the other layer (or film), region, pad, or pattern, or one or more intervening layers may also be present. Such a position of the layer has been described with reference to the drawings.

The thickness and size of each layer (film), region, pattern, or structure shown in the drawings may be exaggerated, omitted or schematically drawn for the purpose of convenience or clarity. In addition, the size of each layer (film), region, pattern, or structure does not utterly reflect an actual size.

Hereinafter, the embodiment of the present invention will be described in detail with reference to accompanying drawings.

Figure 2:
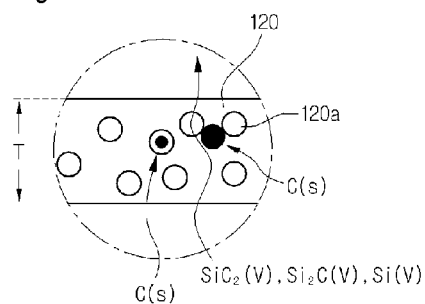
FIG. 2 is an enlarged sectional view showing a part A of FIGS. 1.
Figure 3:
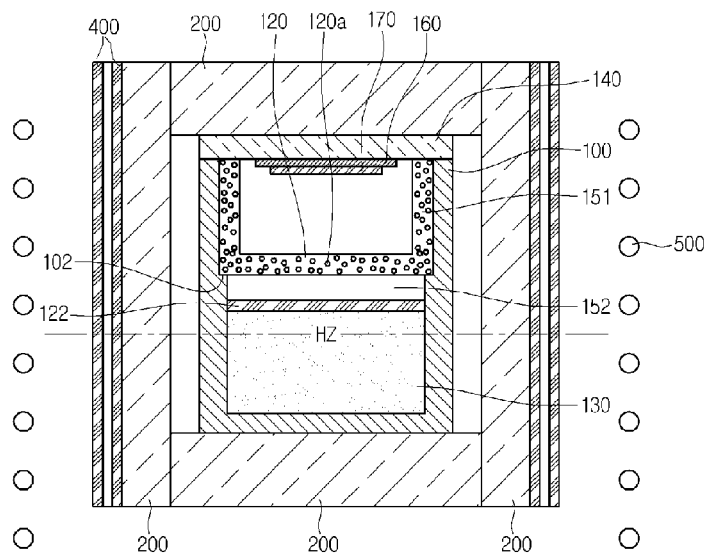
FIG. 3 is a sectional view showing an apparatus of fabricating an ingot according to a second embodiment.

Hereinafter, an apparatus for fabricating an ingot according to the embodiment will be described in detail with reference to FIGS. 1 and 2. FIG. 1 is a sectional view showing an apparatus for fabricating an ingot according to the embodiment, FIG. 2 is an enlarged sectional view showing a part A of FIG. 1, and FIG. 3 is a sectional view showing an apparatus of fabricating an ingot according to a second embodiment.

Referring to FIG. 1, the apparatus for fabricating the ingot includes a crucible 100, a raw material 130, a filter part 120, a top cover 140, a seed holder 160, an adiabatic material 200, a quartz tube 400, and a heat induction part 500.

The crucible 100 receives source materials 130 therein.

The crucible 100 has a cylindrical shape to receive the source materials 130.

The crucible 100 may include a material having the melting point higher than the sublimation temperature of the SiC.

For example, the crucible 100 can be manufactured by using graphite.

In addition, the crucible 100 can be manufactured by coating a material having the melting point higher than the sublimation temperature of the SiC on the graphite. Preferably, a material, which is chemically inert with respect to silicon and hydrogen at the growth temperature for the SiC single crystal 190, is used as the material coated on the graphite. For instance, the material may include metal carbide or nitride carbide. In particular, a mixture including at least two of Ta, Hf, Nb, Zr, W and V and carbide including carbon can be coated on the graphite. Further, a mixture including at least two of Ta, Hf, Nb, Zr, W and V and nitride including nitrogen can be coated on the graphite.

A locking part 102 may be included in the crucible 100. The locking part 102 may protrude in the crucible 100. The filter part 120 may be positioned in the locking part 102. In other words, the filter part 120 may be suspended to the locking part 102. The filter part 120 may be spaced apart from the surface of the raw material 130 through the locking part 102.

The raw material 130 may include silicon (Si) and carbon (C). In detail, the source materials 130 may include a compound containing silicon (Si), carbon (C), oxygen (O), and hydrogen (H). The raw material 130 may include SiC powders or polycarbosilane.

Thereafter, the filter part 120 may be positioned in the crucible 100. The filter part 120 may be positioned between the surface of the raw material 130 and the seed holder 160. In more detail, the filter part 120 may be spaced apart from the surface of the raw material 130. Since the filter part 120 is suspended to the locking part 102, the filter part 120 may be spaced apart from the surface of the raw material 130 by a predetermined distance.

Thereafter, an empty space may be created between an upper portion of the filter part 120 and a lower portion of the filter part 120. A first gas room 151 may be positioned between the filter part 120 and the seed holder 160, and a second gas room 152 may be positioned between the filter part 120 and the surface of the raw material 130. The raw material 130 may be sublimated in the first and second gas rooms 151 and 152.

In the second gas room 152, the gas sublimated from the surface of the raw material 130 may be homogenously and widely condensed on a lower end of the filter 120.

The height of the second gas room 152 may be related to an amount of the introduced raw material 130. In other words, the height of the second gas room 152 may be varied according to the height of the introduced raw material 130. If the raw material 130 includes fine powders, even if the raw material 130 is introduced to the lower portion of the filter part 120, the volume of the raw material 130 is reduced due to the growth of the single crystal, so that the second gas room 152 may be created.

Since the height of the second gas room 152 is related to the diffusion of the sublimated gas, the height of the second gas room 152 may be adjusted suitably to the process conditions. In this case, if the height of the second gas room 152 is excessively low, the surface of the raw material 130 may be attached to the lower portion of the filter part 120 during the process. However, as described above, if the raw material 130 includes fine powders, the surface of the raw material 130 may not be attached to the filter part 120. If the height of the second gas room 152 is excessively high, an amount of the introduced raw material 130 may be significantly reduced, and the growing behavior may not be controlled. The height of the second gas room 152 may be determined by taking the size of the crucible 100, the structure of the crucible 100, and the heating effect of the crucible 100 into consideration.

The first gas room 151 allows gas passing through the filter part 120 to fully and uniformly move to the seed 170. Therefore, a single crystal, which is homogeneous and less defective, can be grown from the seed 170. In addition, the single crystal grown from the seed 170 can be prevented from being formed in a convex shape at the central portion thereof. Therefore, the single crystal can be more effectively used. In other words, the product yield of the wafer obtained from the single crystal can be increased.

Although FIG. 1 shows that the first and second gas rooms 151 and 152 are formed while interposing the filter part 120 therebetween, the embodiment is not limited thereto. Accordingly, a plurality of filter parts 120 are introduced, so that a plurality of gas rooms may be provided.

The filter part 120 may be porous. In other words, the filter part 120 may include a plurality of pores 120a. In detail, the filter part 120 includes inter-fiber pores, and the pores may have various sizes in the range of 0.1 um to 300 um. In addition, the filter part 120 may include fiber surface pores.

Referring to FIG. 2, the pores 120a may filter very small carbon impurities and very small contaminants. In addition, the filter part 120 may transmit $SiC_2$, $Si_2C$ and Si and move $SiC_2$, $Si_2C$ and Si to the seed 170.

The filter part 120 may be positioned so that the distance from the crucible 100 can be minimized, so that the filter part 120 can filter impurities as much as possible.

The filter part 120 may have the thickness T in the range of 1 mm to 10 cm. The thickness T of the filter part 120 may be varied according to the size of the crucible 100, the scale of the crucible 100, and the process condition of the crucible 100. If the filter part 120 has a thickness T of 1 mm or less, the thickness T is excessively thin, so that the durability of the filter part 120 may be significantly degraded, and the filter part 120 may be damaged during the process. In addition, the filter part 120 may not adsorb the carbon impurities or trap the carbon impurities. If the filter part 120 has the thickness T of 10 cm or more, the thickness T is very thick, so that the speed to transmit materials other than carbon impurities may be reduced. In other words, the speed to transmit SiC gas used to grow the single crystal 190 may be reduced. Accordingly, the speed to grow the single crystal 190 may be reduced.

The filter part 120 may have a fibrous structure.

Since the filter part 120 is a continuous fibrous structure, necking (chemical bonding) is formed between fibers. Therefore, the durability of the filter part 120 can be improved, and the filter part 120 can be prevented from being damaged during the process of growing the single crystal. In addition, the manipulation of the filter part 120 is easy, so that the process efficiency can be improved. In addition, SiC gas required for the growth of the single crystal can be uniformly supplied to the seed 170, and the quantity of SiC gas supplied per time can be increased. Therefore, the growing rate of the single crystal 190 can be improved.

In detail, the filter part 120 may include a fibrous membrane.

Since the filter part 120 has a fibrous structure, the filter part 120 may be prepared through one of a melt-spinning scheme, a melt-blown scheme, and an electro-spinning scheme. In other words, the filter part 120 may be realized by performing a fiber spinning process, a fiber loading process, and a heat treatment process of the loaded fiber. However, the embodiment is not limited, and the fibrous filter part 120 may be prepared through various schemes.

The filter part 120 may allow a specific component to selectively pass through the filter part 120. In detail, the filter part 120 may adsorb carbon impurities and contaminants or may trap impurities. In other words, the pores 120a of the filter part 120 may adsorb micro-impurities, and may block large-size impurities between the pores 120a, so that the large-size impurities may be trapped. Therefore, the carbon impurities come from the raw material 130 can be prevented from participating in the process of growing the single crystal 190. If the carbon impurities are moved to the single crystal 190, the single crystal 190 may be defective.

The filter part 120 may include a carbon-based membrane.

The carbon-based membrane may be prepared by compression-molding and calcinating graphite powders. The carbon-based membrane can represent superior durability, a superior penetration property, and superior filterability of impurities. Therefore, if the carbon-based membrane is used as the filter part 120, the high-quality single crystal 190 may be prepared.

However, the embodiment is not limited thereto. Accordingly, the filter part 120 may include various materials representing superior durability, permeability, and filterability of impurities.

Although not shown in drawings, the filter part 120 may include a first layer and a second layer on the first layer. In other words, the filter part 120 may include a plurality of layers.

The pores of the first and second layers may have sizes different from each other.

In detail, the pores of the first layer may be larger than the pores of the second layer.

The first layer can filter large-size carbon particles and impurities existing in the raw materials 130 in the initial stage of growing the single crystal. The second layer can filter micro-carbon impurities and various contaminants which have passed through the first layer.

Since the filter part 120 includes two layers, the infiltration of impurities into the single crystal can be minimized. In addition, gas permeability can be ensured as much as possible.

Thereafter, a top cover 140 may be positioned on the crucible 100. The top cover 140 can seal the crucible 100. The top cover 140 may include graphite.

The seed holder 160 is positioned at the lower end portion of the top cover 140. The seed holder 160 may fix the seed 170. The seed holder 160 may include high-concentration graphite.

The seed 170 is attached to the seed holder 160. Accordingly, the single crystal 190 can be prevented from being grown to the top cover 140 by attaching the seed 170 to the seed holder 160. However, the embodiment is not limited thereto, and the seed 170 may be directly attached to the top cover 140.

The adiabatic material 200 surrounds the crucible 100. The adiabatic material 200 keeps the temperature of the crucible 100 to the level of the crystal growth temperature. Since the crystal growth temperature of the SiC is high, graphite felt may be used as the adiabatic material 200. In detail, the adiabatic material 200 may include a cylindrical graphite felt having a predetermined thickness prepared by compressing graphite fiber. In addition, the adiabatic material 200 may be prepared as a plurality of layers surrounding the crucible 100.

The quartz tube 400 is positioned at an outer peripheral surface of the crucible 100. The quartz tube 400 is fitted around the outer peripheral surface of the crucible 100. The quartz tube 400 may block heat transferred into a single crystal growth apparatus from the heat induction part 500. The quartz tube 400 is a hollow tube and cooling water may circulate through an inner space of the quartz tube 400.

The heat induction part 500 is positioned outside the crucible 100. For instance, the heat induction part 500 is an RF induction coil. As RF current is applied to the RF induction coil, the crucible 100 can be heated. That is, the raw materials contained in the crucible 100 can be heated to the desired temperature.

The center area of the heat induction part 500 is located below the center area of the crucible 100. Thus, the temperature gradient may occur at the upper and lower portions of the crucible 100 so that regions heated at different temperatures appear at the upper and lower portions of the crucible 100. That is, the center area (hot zone; HZ) of the heat induction part 500 is located relatively lower than the center area of the crucible 100, so the temperature of the lower portion of the crucible 100 may be higher than the temperature of the upper portion of the crucible 100 on the basis of the hot zone HZ. In addition, the temperature may rise from the center of the crucible 100 to the outer peripheral portion of the crucible 100. Due to the temperature gradient, the SiC source materials may be sublimated so that the sublimated SiC gas moves to the surface of the seeds 161, 162, and 163 having the relatively low temperature. Thus, the SiC gas is recrystallized, so the SiC single crystal is grown.

Hereinafter, an apparatus for fabricating an ingot according to a second embodiment will be described with reference to FIG. 3. In the following description, the details of structures and components the same as those of the first embodiment or similar to those of the first embodiment will be omitted for the purpose of clear and brief explanation.

FIG. 3 is a sectional view showing an apparatus for fabricating an ingot according to the second embodiment.

According to the apparatus for fabricating the ingot according to the second embodiment, an auxiliary filter part 122 is additionally provided. The auxiliary filter part 122 may be provided on the raw material 130. Through the auxiliary filter part 122, the surface of the raw material 130 can be maintained in a flat state, and the impurities, which may be introduced into the raw materials 130, can be blocked. In addition, the auxiliary filter part 122 controls the sublimation speed of the raw materials 130 in the initial growth stage, so that the high-quality single crystal can be grown.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. An apparatus for fabricating an ingot, the apparatus comprising:
a crucible containing a raw material;
a top cover disposed on the crucible;
a seed holder disposed at a lower end portion of the top cover;
a seed disposed below the seed holder; and
a filter part in the crucible and disposed between a surface of the raw material and the top cover,
wherein the filter part is spaced apart from the surface of the raw material, the seed holder, and the seed.

2. The apparatus of claim 1, wherein a first gas room is interposed between the filter part and the seed holder, and a second gas room is interposed between the filter part and the surface of the raw material.

3. The apparatus of claim 2, wherein the raw material is sublimated in the first and second gas rooms.

4. The apparatus of claim 1, wherein the filter part is disposed on the raw material and disposed along an inner wall of the crucible.

5. The apparatus of claim 1, wherein the filter part extends from an upper portion of the raw material in a longitudinal direction of the crucible.

6. The apparatus of claim 1, wherein the filter part is porous.

7. The apparatus of claim 1, wherein the filter part has a thickness in a range of 1 mm to 10 cm.

8. The apparatus of claim 1, wherein the filter part is a membrane.

9. The apparatus of claim 8, wherein the membrane is a carbon-based membrane.

10. The apparatus of claim 1, wherein the filter part has a fibrous structure.

11. The apparatus of claim 1, wherein the filter part comprises a first layer and a second layer on the first layer.

12. The apparatus of claim 11, wherein a pore of the first layer has a size different from a size of a pore of the second layer.

13. The apparatus of claim 11, wherein a pore of the first layer has a size greater than a size of a pore of the second layer.

14. The apparatus of claim 1, further comprising an auxiliary filter part on the surface of the raw material.

15. The apparatus of claim 14, wherein the auxiliary filter part makes contact with the surface of the raw material.

16. The apparatus of claim 1, further comprising a locking part protruding in the crucible, wherein the filter part is positioned at the locking part.

17. The apparatus of claim 1, wherein the filter part makes contact with a side wall of the crucible.

18. The apparatus of claim 1, wherein the filter part makes contact with the top cover.

19. The apparatus of claim 6, wherein the filter part includes a plurality of pores, and wherein each pore has a size in a range of 0.1 µm to 300 µm.

\* \* \* \* \*